(12) United States Patent
Sankman (10) Patent No.: US 7,638,882 B2
(45) Date of Patent: Dec. 29, 2009

(54) FLIP-CHIP PACKAGE AND METHOD OF FORMING THEREOF

(75) Inventor: Bob Sankman, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 11/963,472

(22) Filed: Dec. 21, 2007

(65) Prior Publication Data

US 2009/0160068 A1    Jun. 25, 2009

(51) Int. Cl.
*H01L 23/48* (2006.01)
*H01L 23/52* (2006.01)
*H01L 29/40* (2006.01)

(52) U.S. Cl. ............... 257/778; 257/777; 257/779; 438/107; 438/108

(58) Field of Classification Search ......... 257/777–779, 257/E21.137, E27.144, E27.161; 438/107, 438/108, 110
See application file for complete search history.

(56) References Cited

U.S. PATENT DOCUMENTS

| 2004/0126547 | A1* | 7/2004 | Coomer | 428/209 |
| 2006/0138591 | A1* | 6/2006 | Amey et al. | 257/532 |
| 2006/0170101 | A1* | 8/2006 | Kaizuka | 257/738 |
| 2008/0000674 | A1* | 1/2008 | Dory et al. | 174/250 |

* cited by examiner

*Primary Examiner*—Phuc T Dang
(74) *Attorney, Agent, or Firm*—Grossman, Tucker, Perreault & Pfleger, PLLC (57) ABSTRACT

A flip-chip package is disclosed. The flip-chip package includes a substrate comprising at least one build-up layer. At least one longitudinal trench is formed in at least one build-up layer of the substrate. The at least one longitudinal trench filled with a conductive material. A conductive plane may be disposed at least partially on the at least one longitudinal trench. An insulating layer may cover the conductive plane and, at least in part, at least one build-up layer of the substrate. The solder resist layer may include a plurality of openings partially exposing the conductive plane. A plurality of conductive pads may be disposed on the conductive plane through the plurality of openings. A method for fabricating the flip-chip package is also disclosed.

15 Claims, 8 Drawing Sheets

FLIP-CHIP PACKAGE AND METHOD OF FORMING THEREOF

FIELD

The present disclosure generally relates to integrated circuits, and, more particularly, to flip-chip packages with low resistance connections between solder bumps of the flip-chip package.

BRIEF DESCRIPTION OF THE DRAWINGS

The advantages and features of the present disclosure will become better understood with reference to the following detailed description and claims taken in conjunction with the accompanying drawings, wherein like elements are identified with like symbols, and in which:

Like reference numerals refer to like parts throughout the description of several views of the drawings.

DETAILED DESCRIPTION OF THE DISCLOSURE

For a thorough understanding of the present disclosure, reference has to be made to the following detailed description, including the appended claims, in connection with the above-described drawings. Although the present disclosure is described in connection with exemplary embodiments, the present disclosure is not intended to be limited to the specific forms set forth herein. It is understood that various omissions and substitutions of equivalents are contemplated as circumstances may suggest or render expedient, but these are intended to cover the application or implementation without departing from the spirit or scope of the claims of the present disclosure. Also, it is to be understood that the phraseology and terminology used herein is for the purpose of description and should not be regarded as limiting.

The terms "first," "second," and the like, herein do not denote any order, quantity, or importance, but rather are used to distinguish one element from another. The terms "a" and "an" herein do not denote a limitation of quantity, but rather denote the presence of at least one of the referenced item.

Figure 1:
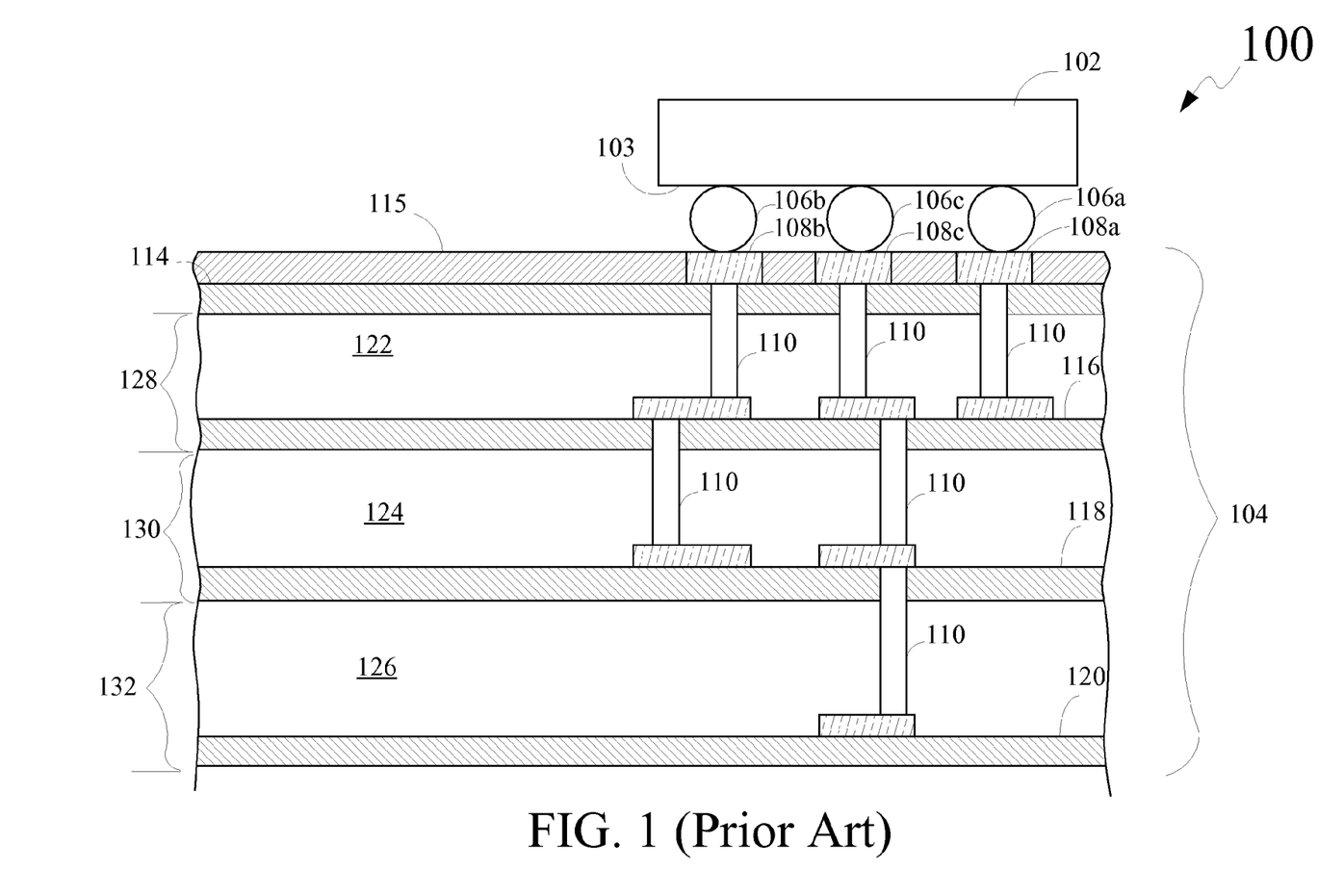
FIG. 1 is a sectional view of a prior art flip-chip package assembly.

FIG. 1 is a sectional view of a prior art flip-chip package assembly 100 (hereinafter referred to as "package 100"). The package 100 comprises a die 102 and a multi-layer substrate 104 (hereinafter referred to as "substrate 104"). The die 102 comprises an active surface 103, which has an electrical circuit fabricated thereon. The substrate 104 may comprise multiple substrate layers stacked over each other. As shown in FIG. 1, the package 100 comprises the substrate 104 having a top surface 114 and three substrate layers, such as a first layer 128, a second layer 130, and a third layer 132. The first layer 128 of the substrate 104 comprises a first insulation layer 122 and a ground plane 116, which is provided with a ground potential (not shown). The second layer 130 of the substrate 104 comprises a second insulation layer 124 and a power plane 118, which is provided with a power supply (not shown). The third layer 132 of the substrate 104 comprises a third insulation layer 126 and a circuit plane 120, which has routing traces thereon.

In a typical package 100, the power plane 118 and the ground plane 116 comprise a copper plate of about 10 micrometers (µm) thickness. The insulation layers 122, 124 and 126 may comprise a dielectric material and are provided to insulate the ground plane 116, the power plane 118 and the circuit plane 120 from each other. Further, the substrate 104 comprises a plurality of conductive pads 108a, 108b and 108c disposed on the top surface 114 of the substrate 104. The conductive pads 108a, 108b and 108c are connected to the ground plane 116, the power plane 118 and the circuit plane 120 respectively (the function of 116, 118 & 120 are interchangeable) through a plurality of micro-vias 110 provided in the insulation layers 122, 124 and 126. A plurality of solder bumps 106a, 106b and 106c are disposed on the conductive pads 108a, 108b and 108c respectively. The solder bumps 106a, 106b and 106c connect to the active surface 103 of the die 102 on one end and to the conductive pads 108a, 108b and 108c respectively, on the other end. Therefore, the solder bumps 106a, 106b and 106c connect the die 102 to the substrate 104 through the conductive pads 108a, 108b and 108c. A solder-resist layer 115 may be deposited on the top surface 114 of the substrate 104, which masks an area around the conductive pads 108a, 108b and 108c, to prevent undesired connection between the conductive pads 108a, 108b and 108c.

Of course, plated openings (PTH) or a combination of micro-vias and PTH may also be provided in the layers 122, 124 and 126 instead of the micro-vias 110 to provide electrical connection between the ground plane 116, the power plane 118 and the circuit plane 120, and the conductive pads 108a, 108b and 108c.

More specifically, the solder bump 106a is disposed on the conductive pad 108a and is electrically connected to the ground plane 116 through a micro-via 110 between the conductive pad 108a and the ground plane 116. Although a single solder bump 106a is shown in FIG. 1, a plurality of such solder bumps 106a may be grouped together to form a group of ground bumps. Similarly, the solder bump 106b is disposed on the conductive pad 108b and is electrically connected to the power plane 118 through micro-micro-vias 110 between the conductive pad 108b and the ground plane 118. A plurality of such solder bumps 106b may be grouped together to form a group of power bumps. Furthermore, the solder bump 106c is disposed on the conductive pad 108c and is electrically connected to the circuit plane 120 through the micro-micro-vias 110 between the conductive pad 108c and the circuit plane 120. A plurality of such solder bumps 106c may be grouped together to form a group of circuit bumps. Therefore, the solder bumps 106a, 106b and 106c act as a group of power bumps, a group of ground bumps and a group of circuit bumps respectively. The group of power bumps, the group of ground bumps and the group of circuit bumps connect the die 102 to the substrate 104. The solder bumps 106a, which are the group of ground bumps, are connected to each other through the ground plane 116. Similarly, the solder bumps 106b, which are the group of power bumps, are connected through the power plane 118.

For most applications, the group of power bumps may be connected through a low resistance path between them, such that transmission of a power level of a power signal from the substrate 104 to the die 102 is maintained at an optimum level. Similarly, the group of ground bumps may be connected through a low resistance path in between them such that transmission of a noise level of an electrical signal from the substrate 104 to the die 102, is reduced. In a typical package, such as the package 100, the thickness of the power plane 118 and the ground plane 116 may be in the range of about 10 µm, which may not provide a sufficient low resistance path between the group of power bumps and between the group of ground bumps. One solution to provide a low-resistance path is to increase the thickness of copper planes used as the power plane 118 and the ground plane 116. The thickness of the planes 116, 118 may be increased to a value of greater than or equal to about 10 µm however the exact value is not relevant to this invention. However, packaging the package 100 with thick ground plane 116 and thick power plane 118 may lead to difficulty while fabricating the package 100 on small form-factor. Accordingly, there exists a need for forming a low resistance path between the solder bumps 106b of the group of power bumps and between the solder bumps 106a of the group of ground bumps of the package 100, without increasing the thickness of the ground plane 116 or the power plane 118.

The present disclosure provides a flip-chip package capable of providing a low resistance path between solder bumps that correspond to a group of power bumps and between solder bumps that correspond to a group of ground bumps. The solder bumps corresponding to the group of power bumps and the group of ground bumps is disposed on a substrate of the package.

Figure 2A:
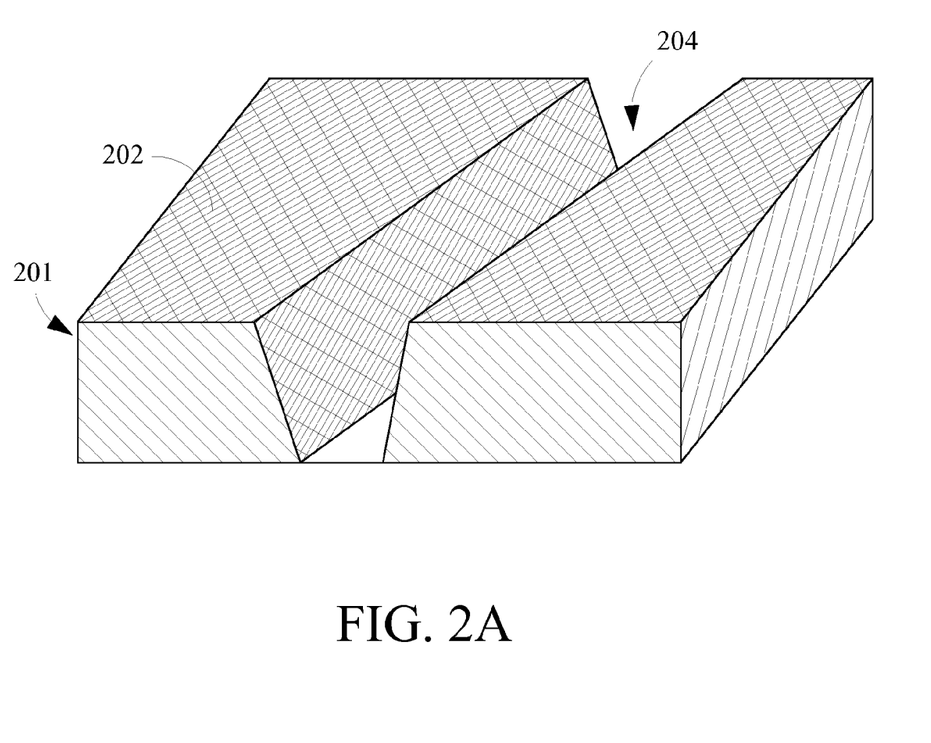
FIGS. 2A through 2E illustrate various stages of preparation of a flip-chip package, according to an exemplary embodiment of the present disclosure.

Referring now to FIGS. 2A through 2E, various stages of preparation of a flip-chip package 200 (hereinafter referred to as 'package 200') are shown, according to an exemplary embodiment of the present disclosure. FIG. 2A describes a first stage of the preparation of the package 200. The first stage of preparation of the package 200 comprises providing a substrate 201. The substrate 201 may comprise multiple layers stacked in parallel, with each layer comprising an organic material such as an epoxy, a polyimide, a polyfluorinated ether, and the like. For sake of simplicity, the substrate 201 is in the form of a single layer, which may be an outer layer 202 of the substrate 201. At least one longitudinal trench such as a longitudinal trench 204 may be formed in the outer layer 202 of the substrate 201 by applying common laser drilling processes. In a laser drilling process, a concentrated laser beam is focused onto the outer layer 202 to remove a substrate material of the outer layer 202. In the present embodiment, the longitudinal trench 204 is shown to extend between two opposite edges of the substrate 201. The said embodiment also shows that the longitudinal trench 204 extends in a vertical direction to cover an entire thickness of the substrate 201. The alignment, height and positioning of the longitudinal trench 204 may be varied as per circuit and fabrication requirements, and is not limited to the embodiment shown in FIG. 2A. Another technique for creating the trench structure is through an imprinting process where a die is stamped into an insulating layer. The pattern created in the insulating layer is a negative image of the die surface and includes the trench structure.

Figure 2B:
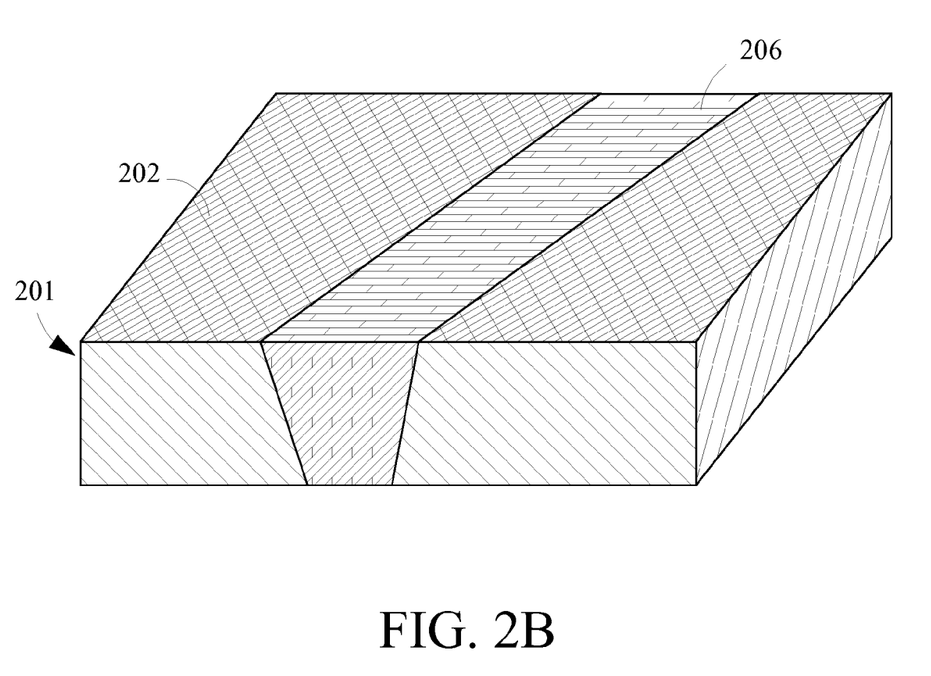
Figure 2C:
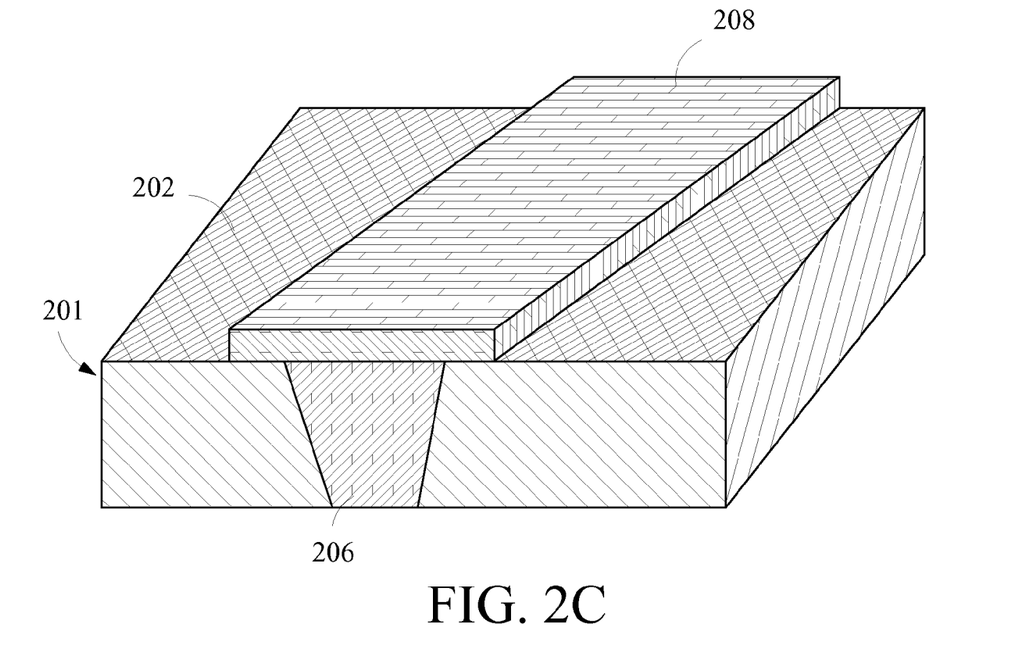

FIG. 2B illustrates a second stage in the preparation of the package 200. The substrate 201 prepared in the first stage is further processed by filling a conductive material 206, such as copper, in the longitudinal trench 204. It will be obvious to a person skilled in the art that other conductive materials may also be used instead of copper to fill the longitudinal trench 204, as per a particular conductivity requirement. FIG. 2C illustrates a third stage in the preparation of the package 200. In the third stage, a conductive plane 208 is disposed on the longitudinal trench 204 filled with the conductive material 206. The conductive plane 208 may be similar to the ground plane 116 or the power plane 118 of the package 100. In this embodiment of the present disclosure, the conductive plane 208 is shown as completely covering the longitudinal trench 204. However, the positioning of the conductive plane 208 is not limited to the described embodiment and may be varied as per requirement. Therefore, the conductive plane 208 may be disposed in a manner such that the conductive plane 208 at least partially covers the longitudinal trench 204. The conductive plane 208 may comprise a copper plane or a plane made of any other conductive material, which may be selected as per electrical conductivity requirements. The conductive plane 208 and the longitudinal trench 204 are electrically connected to each other as the longitudinal trench 204 is filled with a conductive material 206.

Figure 2D:
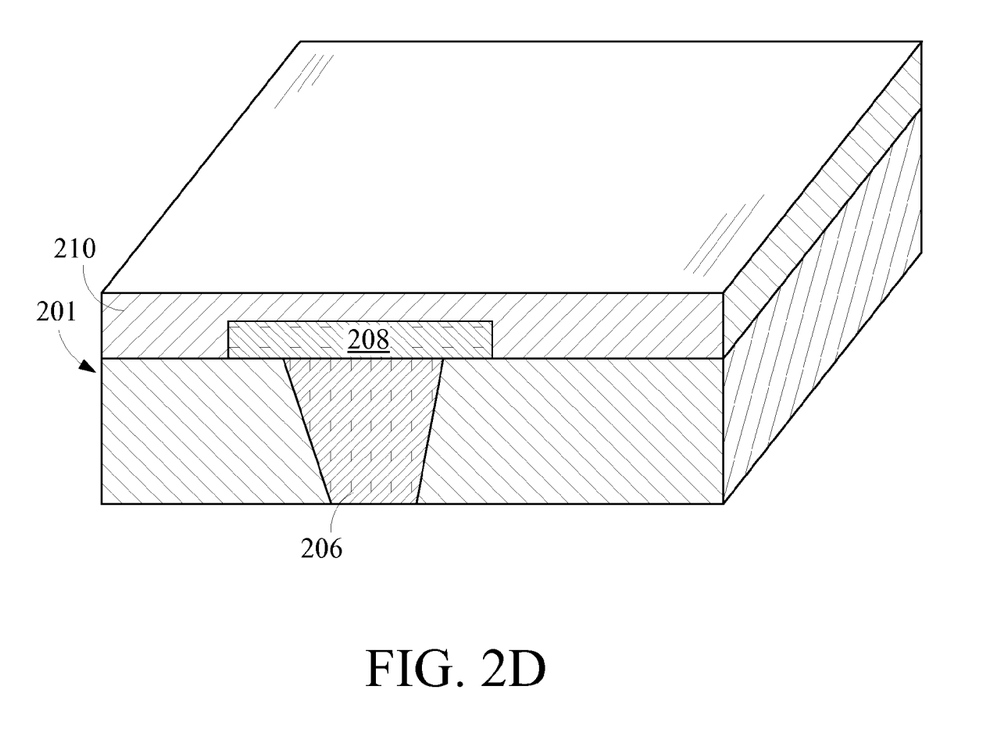

FIG. 2D illustrates a fourth stage in preparation of the package 200. In the fourth stage, a solder resist layer 210 is deposited on the conductive plane 208 and the outer layer 202 of the substrate 201. The solder resist layer 210 may be similar to the solder resist layer 115 as described with reference to FIG. 1. The solder resist layer 210 is in the form of a protective coating over the conductive plane 208, thereby protecting the areas of the conductive plane 208 from unwanted soldering. Also, the solder resist layer 210 serves to protect the outer surface 202 (where solder bumps are not required) from unwanted soldering.

Figure 2E:
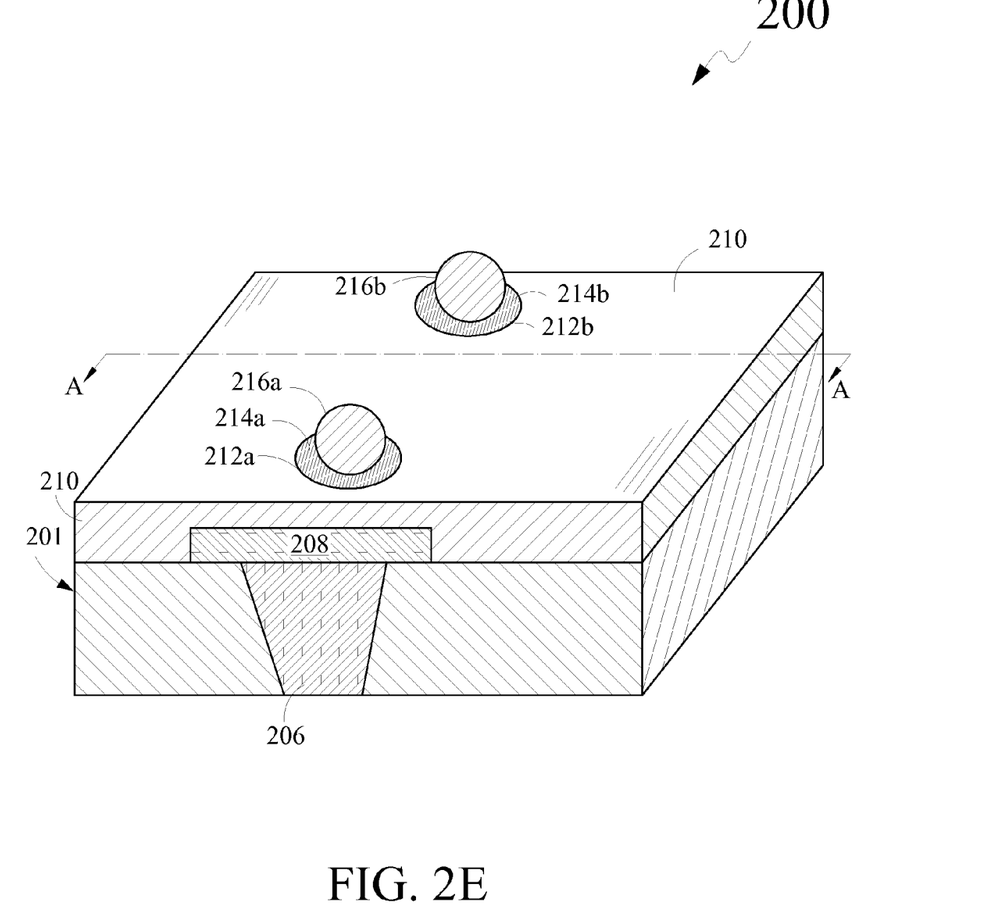

Referring now to FIG. 2E, a fifth stage of the preparation of the package 200 is shown. FIG. 2E also represents the package 200. In the fifth stage, a plurality of openings, such as a opening 212a and a opening 212b are provided in the solder resist layer 210. The openings 212a and 212b may be defined into the solder resist layer 210. The openings 212a and 212b are defined in the solder resist layer 210 in a manner such that the conductive plane 208 is exposed at the regions of the openings 212a and 212b. Further, a plurality of conductive pads such as a conductive pad 214a and a conductive pad 214b are disposed on the conductive plane 208 through the openings 212a and 212b. The conductive pads 214a and 214b are disposed though the openings 212a and 212b such that the conductive pads 214a and 214b make contact with the conductive plane 208. The conductive pads 214a and 214b may be partially exposed above the surface of the solder resist layer 210, which is outside of the openings 212a and 212b. Furthermore, a plurality of solder bumps such as a solder bump 216a and a solder bump 216b are disposed on the conductive pads 214a and 214b respectively.

Although only two solder bump 216a and 216b are shown in FIG. 2E, however, it will be apparent to a person skilled in the art that there may be multiple solder bumps similar to the solder bumps 216a and 216b present in the package 200. The solder bumps 216a and 216b may act as a group of solder bumps for power connection or as a group of solder bumps for ground connection, as described in conjunction with FIG. 1. Further, the conductive pad 214a is connected to the conductive pad 214b through the conductive plane 208, which is formed over the longitudinal trench 204. Therefore, the solder bumps 216a disposed on the conductive pad 214a and the solder bump 216b disposed on the conductive pad 214b are connected through the conductive plane 208, through trench 206. Accordingly, the present disclosure achieves an arrangement in the package 200 which avoids the use of thick conductive planes to form a low-resistance path between solder bumps 216a and 216b. The solder bumps 216a and 216b may be the group of power bumps or the group of ground bumps or solder bumps for any common signal traces. A die similar to the die 102 of the package may be applied over the flip-chip package to form a flip-chip package assembly.

Figure 3:
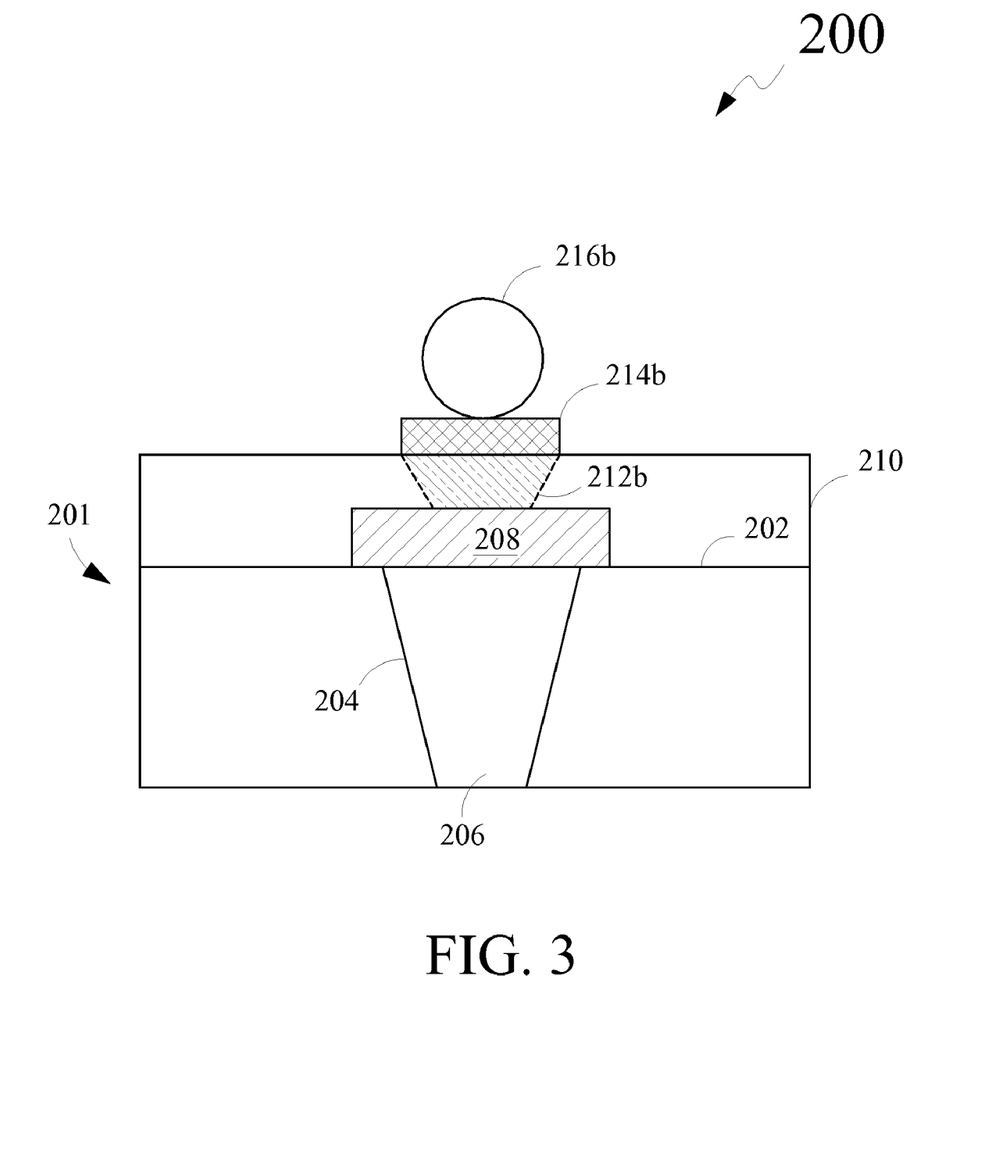
FIG. 3 is a sectional view of the flip-chip package along line A-A of FIG. 2E, according to an exemplary embodiment of the present disclosure.

FIG. 3 illustrates a sectional view of the package 200. The sectional view is obtained by cutting the package 200 along section line A-A of FIG. 2E. The sectional view illustrates the longitudinal trench 204 provided in the outer layer of the substrate 201 and a conductive plane 208 disposed on the longitudinal trench 204, which at least partially covers the longitudinal trench 204. Further, the solder resist layer 210 is disposed on the conductive plane 208 and the outer layer 202 of the substrate 201. The solder resist layer 210 comprises opening 212b disposed in a manner such that at least a portion of the conductive plane 208 is exposed. By referring to FIG. 3, it is evident that the conductive pad 214b is linked to the conductive plane 208 by means of the opening 212b. However, to provide an electrical connectivity between the conductive pad 214b and the conductive plane 208, various techniques may be employed. In an exemplary embodiment of the present disclosure, the opening 212b may be filled with a conductive material. The conductive pad 214b is then disposed on the opening 212b such that the conductive pad 214b is partially within the opening 212b and partially exposed over the solder resist layer 210. Thus, the conductive pad 214b is connected to the conductive plane 208 with the help of the conductive material filled in the opening 212b. In another exemplary embodiment of the present disclosure, the conductive pad 214b may be disposed on the opening such that the conductive pad 214b lies entirely within the opening 212b. In the said embodiment, the conductive pad 214b has dimensions which are comparable to the dimensions of the opening 212b. Thus, the conductive pad 214b is directly connected to the conductive plane 208 without the help of any intermediate material in between. The present disclosure, however, is not limited to the afore-mentioned methods of electrically connecting the conductive pads 214a and 214b to the conductive plane 208. It is obvious to a person skilled in the art that various other modifications to the methods are possible.

Figure 4:
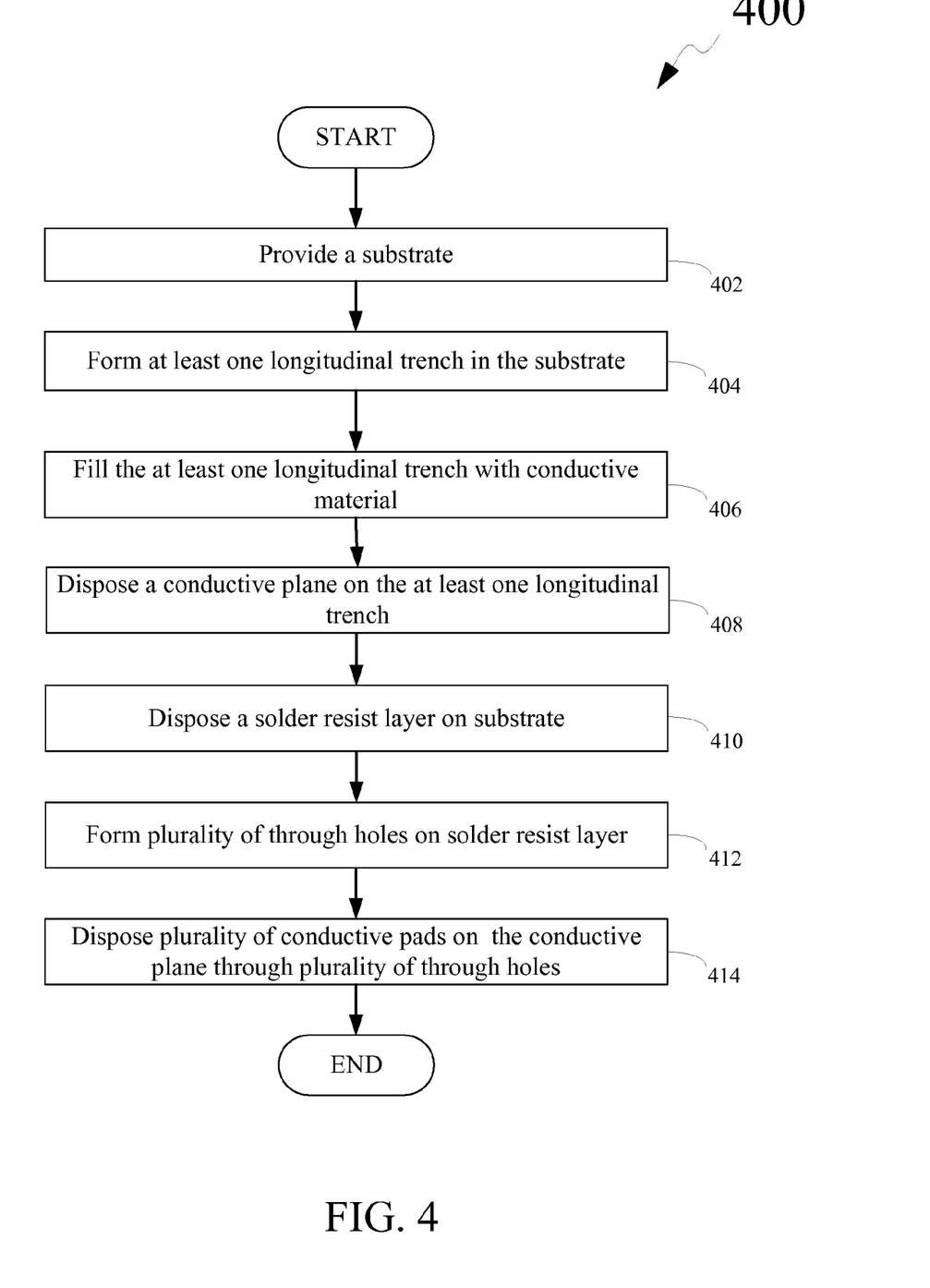
FIG. 4 is a flow diagram illustrating a method for preparing a flip-chip package, according to an embodiment of the present disclosure.

The present disclosure also provides a method for fabricating a flip-chip package. Referring now to FIG. 4, a flow diagram illustrating a method 400 for preparing the flip-chip package is shown, according to an exemplary embodiment of the present disclosure. At 402, the method 400 comprises providing a substrate having at least one build-up layer. At 404, at least one longitudinal trench is formed in at least one layer of the substrate. As described earlier, the at least one longitudinal trench may be formed by applying a laser drilling process. However, other conventional drilling, imprinting or etching processes may also be utilized to form the at least one longitudinal trench. At 406, the method 400 comprises filling the at least one longitudinal trench with a conductive material. In one embodiment of the present disclosure, the conductive material comprises copper (Cu). Further, at 408, a conductive plane is disposed on the at least one longitudinal trench such that the conductive plane at least partially covers the longitudinal trench. In one embodiment of the present disclosure, the conductive plane comprises a plane of copper. Furthermore, at 410 the method 400 comprises disposing a solder resist layer on the conductive plane, which covers the conductive plane and the outer layer of the substrate. At 412, the method 400 comprises forming a plurality of openings in the solder resist or other insulating layer. Thereafter, at 414, the method 400 comprises disposing a plurality of conductive pads on the conductive plane through the plurality of openings. In an embodiment of the present disclosure, the method 400 further comprises disposing a plurality of solder bumps on the plurality of conductive pads to provide connectivity between the substrate and a die.

Various embodiments of the present disclosure offer following advantages. The present disclosure proposes the substrate 201 of the package 200, which facilitates low-resistance connection of the solder bumps 212a and 212b through the longitudinal trench 204 and the conductive plane 208. A thick longitudinal trench 204, provided in the substrate 201, avoids the use of thick conductive planes 208 to provide a low resistance path between the conductive pads 214a, 214b and therefore, the package 200 may be fabricated on small form-factor in a cost effective manner. Further, the package 200 of the present disclosure requires relatively less number of micro-micro-vias or Plated Through Hole (PTH), which further improve the ease of production and result in cost reduction for forming the package 200. It also can facilitate a more effective low resistance power delivery network The foregoing descriptions of specific embodiments of the present disclosure have been presented for purposes of illustration and description. They are not intended to be exhaustive or to limit the present disclosure to the precise forms disclosed, and obviously many modifications and variations are possible in light of the above teaching. The embodiments were chosen and described in order to best explain the principles of the present disclosure and its practical application, to thereby enable others skilled in the art to best utilize the present disclosure and various embodiments with various modifications as are suited to the particular use contemplated. It is understood that various omission and substitutions of equivalents are contemplated as circumstance may suggest or render expedient, but such are intended to cover the application or implementation without departing from the spirit or scope of the claims of the present disclosure.

What is claimed is:

1. A flip-chip package comprising:
    a substrate comprising at least one build-up layer;
    at least one longitudinal trench formed in said substrate, said longitudinal trench extending from one edge of said substrate to an opposite edge of said substrate and said longitudinal trench being as thick as said substrate, the at least one longitudinal trench filled with a conductive material;
    a conductive plane disposed at least partially on the at least one longitudinal trench; and
    a solder resist layer covering, at least in part, the conductive plane and the outer layer of the at least one layer of the substrate, said solder resist layer comprising a plurality of openings extending through to said conductive plane.

2. The flip-chip package of claim 1, further comprising a plurality of conductive pads disposed on the conductive plane through the plurality of openings.

3. The flip-chip package of claim 2, further comprising a plurality of solder bumps disposed on the plurality of conductive pads.

4. The flip-chip package of claim 1, wherein the conductive material filled in the at least one longitudinal trench comprises copper.

5. The flip-chip package of claim 1, wherein the conductive plane comprises copper.

6. The flip-chip package of claim 1, wherein said build-up layer comprises an outer layer of said substrate.

7. The flip-chip package of claim 1, wherein said build-up layer comprises an inner layer of said substrate.

8. A method for fabricating a flip-chip package, the method comprising:
    providing a substrate comprising at least one build-up layer;
    forming at least one longitudinal trench in the substrate, the longitudinal trench extending from one edge of the substrate to an opposite edge of the substrate and the longitudinal trench being as thick as the substrate;

filling the at least one longitudinal trench with a conductive material;

disposing a conductive plane at least partially covering the at least one longitudinal trench; and disposing a solder resist layer covering, at least in part, the conductive plane and the outer layer of the at least one layer of the substrate, said solder resist layer comprising a plurality of openings extending through to said conductive plane.

9. The method of claim 8, forming a plurality of openings in the insulating layer.

10. The method of claim 9, further comprising disposing a plurality of conductive pads on the conductive plane through the plurality of openings.

11. The method of claim 10, further comprising disposing a plurality of solder bumps on the plurality of conductive pads.

12. The method of claim 8, wherein the conductive material filled in the at least one longitudinal trench comprises copper.

13. The method of claim 8, wherein the conductive plane comprises copper.

14. The method of claim 8, wherein said build up layer comprises an outer layer of said substrate.

15. The method of claim 8, wherein said build up layer comprises an inner layer of said substrate.

* * * * *